United States Patent [19]

Farquhar

[11] Patent Number: 4,820,113

[45] Date of Patent: Apr. 11, 1989

[54] HEAD FOR ATTACHMENT TO A ROBOT TO PICK UP ARTICLES

[75] Inventor: James J. Farquhar, San Jose, Calif.

[73] Assignee: Alliance Automation Systems, Inc., Rochester, N.Y.

[21] Appl. No.: 80,619

[22] Filed: Aug. 3, 1987

[51] Int. Cl.⁴ .............................................. B66C 1/10
[52] U.S. Cl. ...................................... 414/736; 901/37; 901/47
[58] Field of Search ................. 414/736, 226; 901/29, 901/37, 47, 36; 29/792

[56] References Cited

U.S. PATENT DOCUMENTS

| | | | |
|---|---|---|---|
| 4,042,122 | 8/1977 | Espy et al. | 901/29 X |
| 4,460,826 | 7/1984 | Pryor | 901/47 X |
| 4,494,973 | 1/1985 | Perry | 414/736 X |
| 4,505,636 | 3/1985 | Sugino et al. | 901/37 X |
| 4,565,400 | 1/1986 | Nakashima et al. | 414/736 X |
| 4,586,869 | 5/1986 | Nihei | 414/736 |
| 4,655,676 | 4/1987 | Janneborg et al. | 414/736 |
| 4,727,471 | 2/1988 | Driels et al. | 901/47 X |

FOREIGN PATENT DOCUMENTS

| | | | |
|---|---|---|---|
| 164210 | 12/1985 | European Pat. Off. | 901/29 |
| 240166 | 10/1986 | German Democratic Rep. | 901/29 |
| 242520 | 4/1987 | German Democratic Rep. | 901/29 |
| 52-18531 | 4/1977 | Japan | 414/736 |
| 2041262 | 9/1980 | United Kingdom | 901/37 |

Primary Examiner—Robert J. Spar
Assistant Examiner—William M. Hienz
Attorney, Agent, or Firm—Gerald L. Moore; John R. Benefiel; Raymond J. Eifler

[57] ABSTRACT

A parts manipulator formed by a head and a robot (10) for attachment to a robot arm and rotatable therewith, the head including a rotatable mount (26) attached to the robot arm (19) and a plurality of gripper mechanisms (21) secured about the mount (26). Each gripper mechanism includes a set of finger portions (51), each selectively and independently of each other shiftable between first and second orientations on the mount to extend either parallel to and downwardly from, or outwardly from the mount (26), allowing flexibly programmed handling of a part.

7 Claims, 3 Drawing Sheets 4,820,113

HEAD FOR ATTACHMENT TO A ROBOT TO PICK UP ARTICLES

CROSS REFERENCE TO RELATED APPLICATIONS

U.S. Ser. No. 07/017,366 filed Feb. 24, 1987, now abandoned, entitled Mechanical Head for a Robot, James J. Farquhar and Robert N. Brown, inventors and assigned to the same assignee as this application.

BACKGROUND OF THE INVENTION

1. Field of the Invention

This invention relates to a mechanism for attachment to a robot head to enable the robot to pick up or manipulate articles such as electronic components and place them in specific locations such as on a printed circuit board.

2. Description of the Prior Art

The above mentioned application discloses a head for attachment to a robot for picking up articles supplied by a feeder mechanism, and moving those articles to precise locations for incorporation in other devices. Specifically, one of the main uses for such mechanisms is to pick up electronic components and insert them into preselected locations during assembly of a printed circuit board.

Such devices muxst be able to pick up articles that are small and delicate and move those articles to predetermined locations within fractions of millimeters in accuracy. Additionally, such mechanisms must be capable of handling more than one type of component and, in order to save time, should be able to handle several different components at once such that each mechanism can be shifted into an operative position for picking up a component and when not in use, be shifted out of the way to make room for another mechanism to function. Further, the mechanism must be made to work in conjunction with the capabilities of the robot and make use of all of the robotic functions available.

It is the primary object of the present invention to provide an improved mechanism for attachment to a robot for transporting, placing and manipulating articles.

SUMMARY OF THE INVENTION

The present invention comprises an apparatus for manipulating parts by a positioning device such as a robot arm in which a head supported on the arm carries a mount on which are secured a plurality of gripper mechanisms arrayed about a rotatable vertical axis of the arm. Each of the gripper mechanisms has a set of opposed finger portions movable together to enable gripping of a part. Each set of finger portions is selectively shiftable on the mount between first and second orientations, extending either parallel to the mount, i.e., downwardly, or outwardly from the mount. This enables each set of finger portions to be positioned individually in either orientation for programmed manipulation of parts. A central camera lens attached to the mount, enables viewing of the space adjacent any set of finger portions when oriented extending downwardly to aid in positioning of the gripper mechanisms.

DESCRIPTION OF A PREFERRED EMBODIMENT OF THE INVENTION

Figure 1:
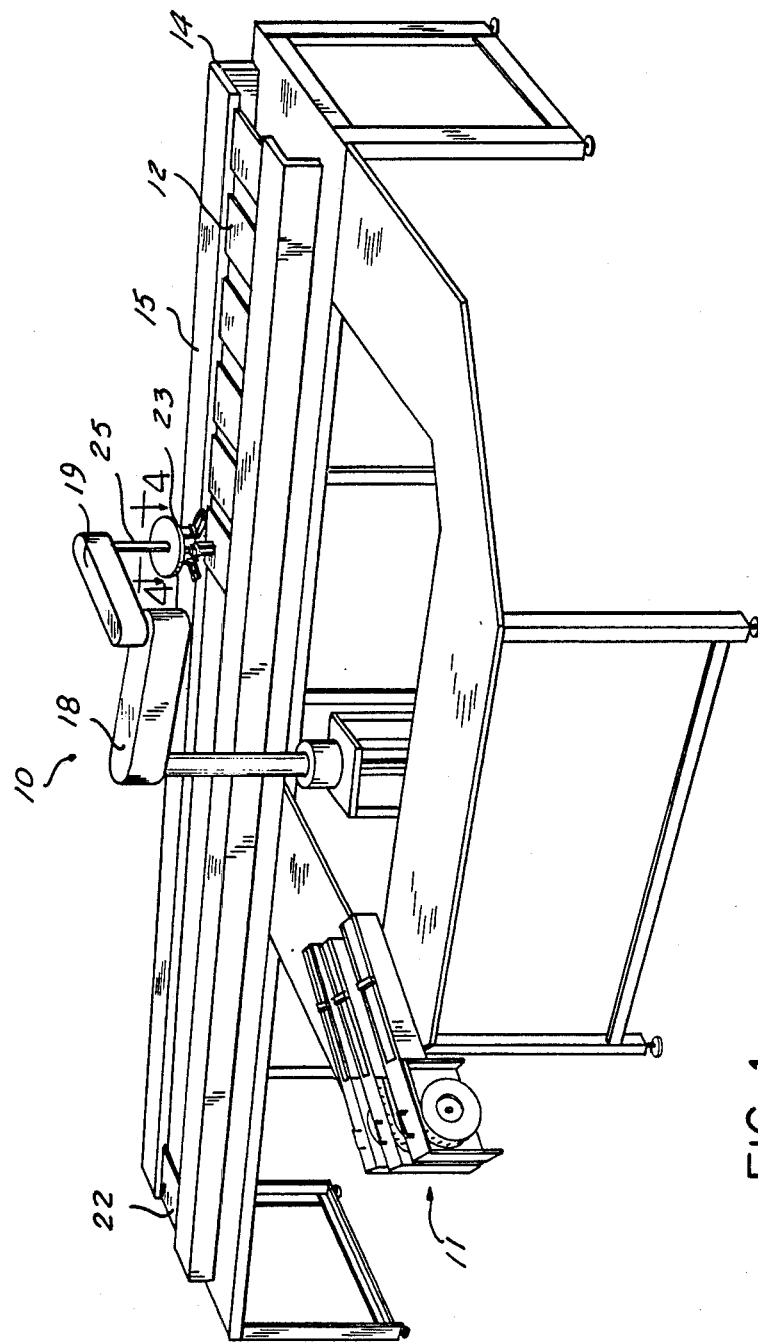
FIG. 1 is a perspective view of a robotic mechanism with which the subject invention is used.
Figure 3:
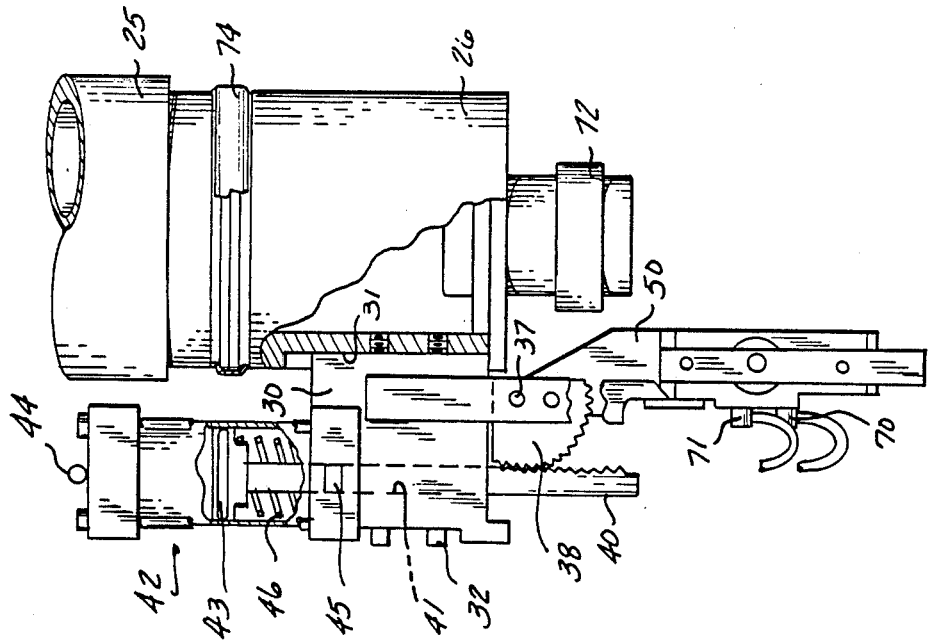
FIG. 3 is an enlarged side view, partially in cross section, of the mechanism in the operative position.

FIG. 1 is a typical installation wherein the parts manipulator of the subject invention can be used. Shown therein is a robot 10 for manipulating parts as by feeding parts from feeder stations 11 to printed circuit boards 12 positioned on a conveyor 14. As the conveyor moves the printed circuit boards to the position 15, the robot shifts movable portions comprised of the arms 18 and 19 to move the head to a position first to pick up components with one of a gripper mechanisms 21 included in the head and thereafter to place those components into the printed circuit boards by manipulating of the arms 18, 19 and head. After the printed circuit boards are loaded, they are moved to the off loading station 22. While there are other uses for the invention, one primary use is in conjunction with the robot mechanism just described. The robot includes a quill 25 extending vertically downward from the arm 19 to which is attached a printed circuit board 23 included in the head and in which is secured a mount 26 (FIGS. 2 and 3) also included, which can be rotated and precisely positioned.

In accordance with the present invention, a plurality of gripper mechanisms 21 are positioned circumferentially spaced about the mount 26. These gripper mechanisms can be actuated to shift the finger portions together as a unit between a first up and retracted orientation (FIG. 2) extending transversely, normal to the axis of rotation of the arm 19 and mount 26 and a second, down and operative position extending away from the mount (FIG. 3) extending parallel to the axis of rotation of the arm 19 and mount 26. Thus with the gripper finger portions 51 of a gripper mechanism 21 in the first orientation they can be utilized to manipulate or grasp articles from a vertical stack, but usually are placed in this orientation so that a single set of gripper finger portions 51 of a gripper mechanism 21 extends downward and can be maneuvered as desired. With the gripper finger portions 51 of a selected gripper mechanism 21 in the second orientation, they extend downwardly for functioning below the mount 26. Thus by shifting one or more of the sets of finger gripper portions 51 to either the first or second orientation, manipulations can be effected as programmed.

Each gripper mechanism 21 comprises a base member 30 adapted to be fixed to the flat 31 on the mount 26 by screws 32. In the embodiment shown, there are eight flats formed, all equally spaced around the mount 26. Fixed to each side of the base is a standard 25. Through aligned openings in the standards a pin 37 extends to pivotally support a segment pinion gear 38. Interfitting with the segment pinion gear 38 is a rack 40 extending through an opening 41 in the base and fixed to the actuator piston 43 of an air driven cylinder 42. Thus as the cylinder is energized by air from a supply (not shown) and passed through the fitting 44, the rack 40 is urged to be driven downward into the position shown in FIG. 3, pivoting the segment pinion gear 38 in a counter clockwise direction from a first position shown in FIG. 2 to a second position shown in FIG. 3. Pressured air supplied to the fitting 45 returns the actuator to the upward position. A spring 46 assures that the actuator piston 43 always returns to the position shown in FIG. 2 when no pressured air is supplied or air is lost to the gripper mechanism 21.

Fixed to the segment pinion gear is a gripper body 50 provided to support the gripper finger portions 51. These gripper finger portions 51 comprise of each gripper mechanisms 21 a pair of gripper fingers 54 and 55. Each is supported on a pair of guide rods 56 and 57. The guide rods 56,57 are each supported in a ball cage bearing 58 which rides in the ground cylinders 59.

Figure 2:
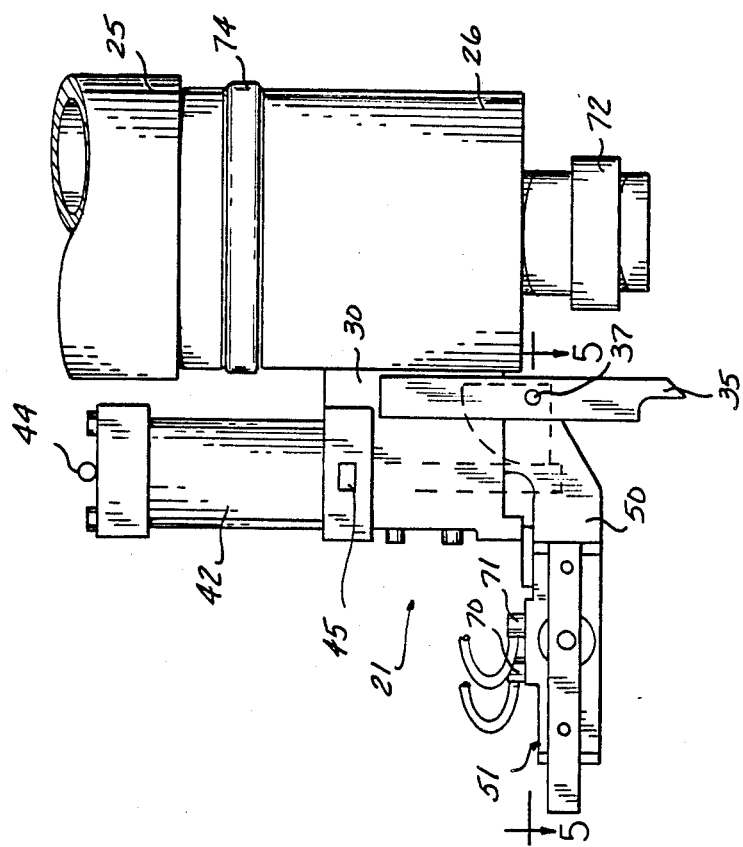
FIG. 2 is an enlarged side view showing the mechanism attached to the robot arm and in the retracted position.
Figure 5:
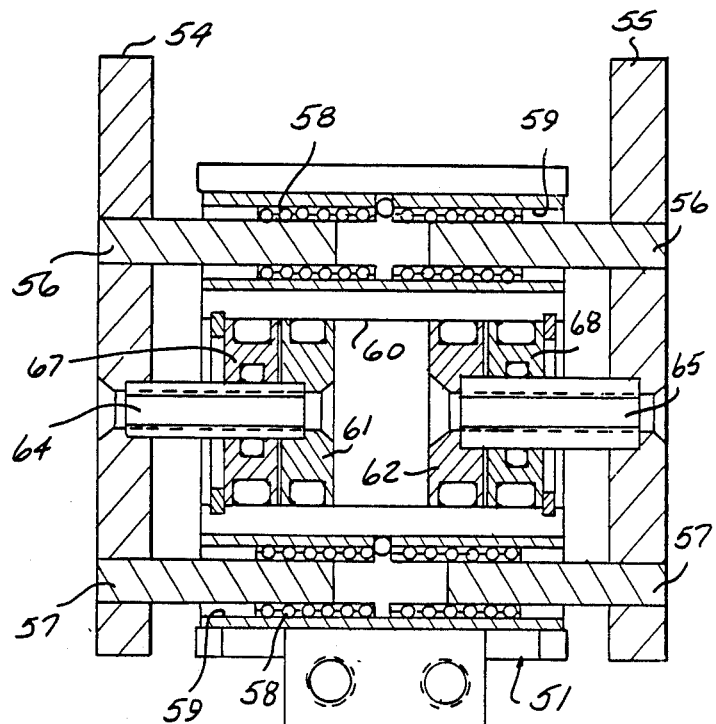
FIG. 5 is an enlarged cross sectional view along the line 5—5 of FIG. 2 showing the gripper mechanism.
Figure 4:
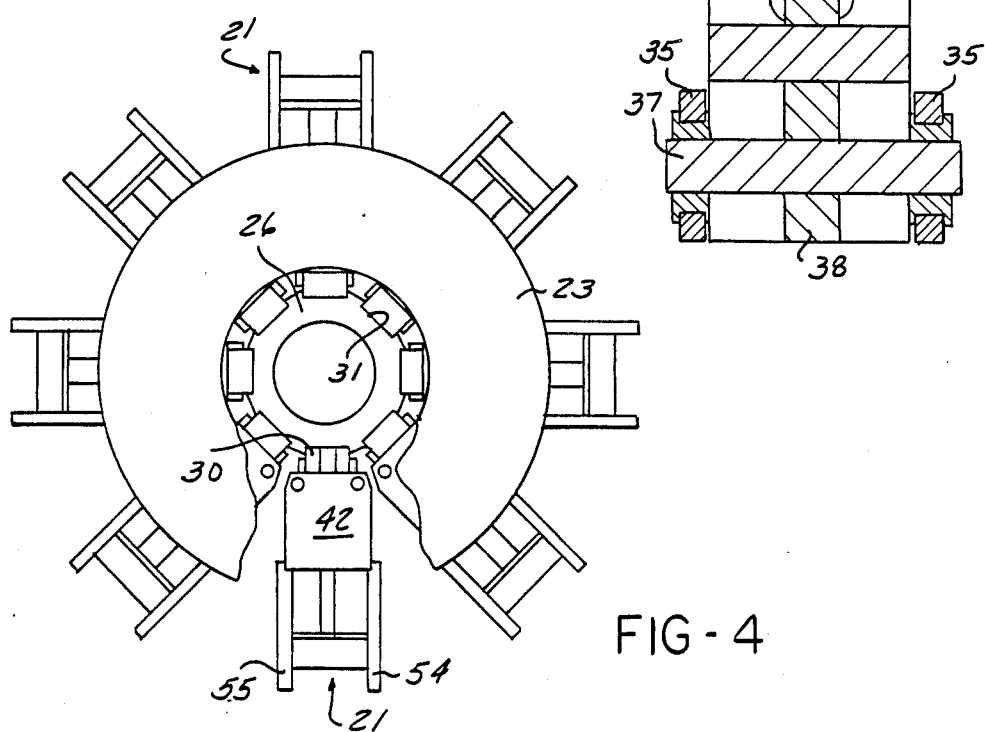
FIG. 4 is a view, partially cut away, along the line 4—4 of FIG. 1.

To actuate the opposing finger 54 and 55 there is provided the cylinder 60 in which are positioned the opposing pistons 61 and 62 fixed by the piston rods 64 and 65 to the fingers 54 and 55 respectively. Rod seals 67 and 68 seal the outer ends of the cylinder 60 around the piston rods. By making the piston rod 64 slightly smaller, the finger 54 is always actuated with greater force when pressured fluid is supplied to the cylinder 60 thereby making the finger 54 the reference finger. Pressured fluid is supplied and exhausted through the fittings 70 and 71 (FIG. 2).

From the foregoing it is apparent that by the proper energization of the robot, the head mechanism can be positioned for use of a selected one of the gripper mechanisms 21. The gripper mechanisms 21 are also positioned by rotation of the mount 26 about the axis of the arm 19. By energization of the actuator 42 the gripper finger portions 51 of each of the gripper mechanisms 61 can be actuated downward as desired while the others can be left in the raised orientation out of the way. A camera lens 72 positioned at the end of the mount 26 central to the gripper mechanisms 21 allows for a comparison of the actual image detected to a recorded image through electronic components (not shown) for precise positioning of the gripper mechanisms 21. Additionally a force sensor 74 can be employed to indicate forces on the quill for more precise manipulation of the gripper mechanisms 21.

I claim:

1. A parts manipulator comprising:
   a part positioning device (10) having movable portions (18, 19, 25) and carrying a gripper mount (26) attached to one (25) of said movable portions of said part positioning device (10);
   a plurality of gripper mechanisms (21) mounted about said gripper mount (26);
   each of said gripper mechanisms (21) including a set of relatively movable opposed gripper finger portions (51) and means (60,61,62,64,65) for selectively moving said gripper finger portions (51) together so as to enable said gripper mechanism (21) to grip a part;
   a plurality of mounting means, (37,50) each mounting a set of said gripper finger portions (51) of a respective one of said gripper mechanisms (21) to be shiftable as a set about a horizontal axis relative to said mount (26) between a first upper orientation and a second lower orientation, said gripper finger portions (51) in said first orientation directed in another direction than when in said second orientation;
   actuation means (42) associated with each of said gripper mechanisms (21) operable to enable each set of said finger portions (51) to be shifted between said first and second orientations independently of each other, whereby the finger portions (51) of any selected one of said plurality of gripper mechanisms (21) may be positioned in either said first or second orientations for handling of a part upon actuation by said actuation means (42).

2. The parts manipulator according to claim 1 wherein said mounting means (37,50) comprises a pivotal mounting (37) of said gripper finger portions (51) to be swingable between said first orientation in which said finger portions (51) are directed outwardly from said mount (26) and said second orientation in which said finger portions (51) extend downwardly from said mount (26).

3. The parts manipulator according to claim 2 further including downwardly facing camera lens means (72) centrally located between said plurality of gripper mechanisms (21), positioned to view the space adjacent any of said gripper finger portions (51) when shifted to said second orientation.

4. The parts manipulator according to claim 1 wherein a plurality of pairs of gripper mechanisms (21) are arrayed about said mount (26) in oppositely positioned pairs.

5. The parts manipulator according to claim 1 wherein said actuation means (60) includes selectively activated means (42) associated with each of said gripper mechanisms (21) urging said associated finger portions (51) to said second orientation, and further including retraction means causing said associated gripper finger portions (51) to shift to said first orientation whenever said gripper finger portions (51) are not urged to said second orientation.

6. The parts manipulator according to claim 2 wherein said mount (26) is rotatable about a vertical axis, and said mounting means (37,50) orients each of said gripper finger portions (51) to extend generally parallel to said vertical axis of rotation in said second orientation and normally to said vertical axis of rotation in said first orientation.

7. The parts manipulator according to claim 6 wherein each of said gripper finger portions (51) are pivotably mounted by its respective mounting means (37,50) to be swingable from said second orientation parallel to said axis of rotation of said mount (26) to said first orientation extending outwardly from said axis of rotation of said mount (26).

* * * * *